(12) United States Patent
Suresh et al.

(10) Patent No.: US 9,165,099 B2
(45) Date of Patent: Oct. 20, 2015

(54) ADAPTIVE CLOCK MANAGEMENT IN EMULATION

(71) Applicant: Mentor Graphics Corporation, Wilsonville, OR (US)

(72) Inventors: Krishnamurthy Suresh, New Delhi (IN); Charles W. Selvidge, Wellesley, MA (US); Sanjay Gupta, Noida (IN); Amit Jain, Sriganganaga (IN); Satish Kumar Agarwal, Giridih (IN)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

(21) Appl. No.: 14/087,531

(22) Filed: Nov. 22, 2013

(65) Prior Publication Data
US 2015/0100931 A1  Apr. 9, 2015

(51) Int. Cl.
*G06F 17/50* (2006.01)

(52) U.S. Cl.
CPC .................................. *G06F 17/505* (2013.01)

(58) Field of Classification Search
USPC ........................................................ 716/104
See application file for complete search history.

(56) References Cited

U.S. PATENT DOCUMENTS 7,222,315 B2 * 5/2007 Schubert et al. .............. 716/106

* cited by examiner

*Primary Examiner* — Thuan Do

(57) ABSTRACT

Aspects of the invention relate to techniques for adaptive clock management in emulation. A clock suspension request signal, indicating when a suspension of design clock signals in an emulator is needed, is generated based on activity status information of the emulator with one or more emulator resources such as software environment. A clock suspension allowance signal, indicating whether a suspension of design clock signals is permitted considering dynamic targets in the emulator, is generated based on slack information related to one or more clock signals associated with one or more dynamic targets of the emulator. Based on the clock suspension request signal and the clock suspension allowance signal, a clock suspension signal is generated for enabling temporary design clock suspensions.

27 Claims, 8 Drawing Sheets

Flow chart
100

ADAPTIVE CLOCK MANAGEMENT IN EMULATION

RELATED APPLICATIONS

This application claims priority to an India patent application, entitled "Adaptive Clock Management In Emulation," filed on Oct. 9, 2013 and accorded Application Number 4579/CHE/2013, which application is incorporated entirely herein by reference.

FIELD OF THE INVENTION

The present invention relates to the field of circuit design verification technology. Various implementations of the invention may be particularly useful for adaptively managing clocks in an emulation system to meet different speed requirements from emulator resources and dynamic targets.

BACKGROUND OF THE INVENTION

Modern integrated circuit designs have become extremely complex. As a result, various techniques have been developed to verify that circuit designs will operate as desired before they are implemented in an expensive manufacturing process. For example, logic simulation is a tool used for verifying the logical correctness of a hardware design. Designing hardware today involves writing a program in the hardware description language. A simulation may be performed by running that program. If the program (or model) runs correctly, then one can be reasonably assured that the logic of the design is correct at least for the cases tested in the simulation.

Software-based simulation, however, may be too slow for large complex designs such as SoC (System on Chip) designs. Although design reuse, intellectual property, and high-performance tools all can help to shorten SoC design time, they do not diminish the system verification bottleneck, which consumes 60-70% of the design cycle. Hardware emulation provides an effective way to increase verification productivity, speed up time-to-market, and deliver greater confidence in final products. In hardware emulation, a portion of a circuit design or the entire circuit design is emulated with an emulation circuit or "emulator."

Two categories of emulators have been developed. The first category is programmable logic or FPGA (field programmable gate array)-based. In an FPGA-based architecture, each chip has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route is performed on the FPGA chips in a way that preserves the connectivity in the original circuit design. The programmable logic chips employed by an emulator may be commercial FPGA chips or custom-designed emulation chips containing programmable logic blocks.

The second category of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. Whether FPGA-based or processor-based, an emulator performs circuit verification in parallel since the entire circuit design executes simultaneously as it will in a real device. By contrast, a simulator performs circuit verification by executing the hardware description code serially. The different styles of execution can lead to orders of magnitude differences in execution time.

An emulator typically has an interface to a workstation server (workstation). The workstation provides the capability to load the DUV (design under verification, also referred to as DUT—design under test) model, controls the execution over time, and serves as a debugging interface into the DUV model on the emulator. Due to software nature of operations in the workstation, communications between the workstation and the emulator during emulation often require slowing down or even temporarily suspending design clock signals running in the emulator. This is particularly true for emulators used in a simulation acceleration environment or in a hardware/software co-verification environment. In addition to communications with the workstation, other activities such as the need for multiple accesses to a hardware resource may also require slowing down or temporarily suspending design clock signals running in the emulator. For example, the design may need to read/write several locations of a design memory though a limited number of ports before the next associated design clock rising edge. In order to emulate these operations according to the design, the design clock signals may have to be suspended for a number of cycles of the emulator infrastructure clock signal. The rest of this disclosure focuses on using communications with the workstation as an example to illustrate various implementations of the invention. A person of ordinary skill in the art, however, would appreciate that the present invention can be applied to other activities that may need adaptive clock management according to various embodiments of the invention.

In an in-circuit-emulation (ICE) environment, on the other hand, an emulator models a part of a system and connects to real hardware that serves as another part of the system. The real hardware is often referred to as target(s). Even though the emulator can operate at a raw speed up to a few MHz, a target typically has to operate at a slower frequency than in a normal operational mode to match the clock rate of the emulator. For example, PCI's lowest bus frequency is 33 MHz, which is too fast for emulation.

As seen from the above, communications of an emulator with its software environment and with its hardware targets have conflicting clock speed preferences. This may not be problematic as long as targets are static. A target is static if the emulator can temporarily suspend design clock signals. During emulation, temporary suspension of design clock signals can be used when there is a need to compensate for the slow speed of software execution. Emulation resumes normally when the design clock signals are restarted.

A dynamic target, however, requires design clock signals to run continuously above a threshold speed. For example, if a personal computer is connected to the emulator through a PCIe bus as a target, the protocol may run into timeout errors if the clock signal associated with the PCIe bus is stopped for too long or is running at a speed too slow. Typically, a speed-bridging device may be inserted between the emulator and the dynamic target to bridge the speed gap. Even with this device in place, there may still be a threshold speed (although more manageable now) above which the clock signal supplied to the dynamic target by the emulator has to run. It is thus desirable to search for techniques that can adaptively manage clock signals for an emulator to optimize its overall performance.

BRIEF SUMMARY OF THE INVENTION

Aspects of the invention relate to techniques for adaptive clock management in emulation. With various embodiments of the invention, logic for generating a clock suspension request signal and logic for generating a clock suspension allowance signal are synthesized.

The clock suspension request signal, indicating when a suspension of design clock signals is needed, is generated based on activity status information of an emulator with one or more emulator resources. The one or more emulator resources may comprise software environment such as the workstation for the emulator. Additionally or alternatively, the one or more emulator resources may comprise hardware resources such as a design memory. The activity status information may be determined based on data generation speed information, data transfer speed information, data buffer status information, or any combination thereof.

The clock suspension allowance signal, indicating whether a suspension of design clock signals is permitted considering dynamic targets in the emulator, is generated based on slack information. The slack information may be determined based in part on speed constraints of one or more clock signals associated with one or more dynamic targets of the emulator. The speed constraints of the one or more clock signals may comprise information of a maximum number of emulator infrastructure clock periods allowed for suspending each of the one or more clock signals.

Logic for generating a clock suspension signal based on the clock suspension request signal and the clock suspension allowance signal is synthesized. The clock suspension signal is generated for enabling temporary suspensions of design clock signals in the emulator. The clock suspension signal may be activated only when both of the clock suspension request signal and the clock suspension allowance signal are activated. Here, activation of the clock suspension request signal indicates a clock suspension request; activation of the clock suspension allowance signal indicates that a design clock suspension is permitted; and activation of the clock suspension signal enables a design clock suspension.

Various kinds of heuristics for activating the clock suspension signal may be employed to strike a desired trade-off between minimizing activity data loss and maintaining system performance such as speed. In some applications, the clock suspension signal may be activated immediately after the clock suspension request signal is activated. In some other applications, the clock suspension signal may be activated if a next design clock edge is for a clock signal associated with a dynamic target. In still some other applications, the clock suspension signal may be activated when a data buffer for communication with the software environment is filled to a threshold level.

DETAILED DESCRIPTION OF THE INVENTION

Various aspects of the present invention relate to techniques for adaptive clock management in emulation. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "synthesize," "generate" and "determine" to describe the disclosed method or the device function/structure. Such terms are high-level abstractions. The actual operations or functions/structures that correspond to these terms will vary depending on the particular implementation and are readily discernible by one of ordinary skill in the art.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1:
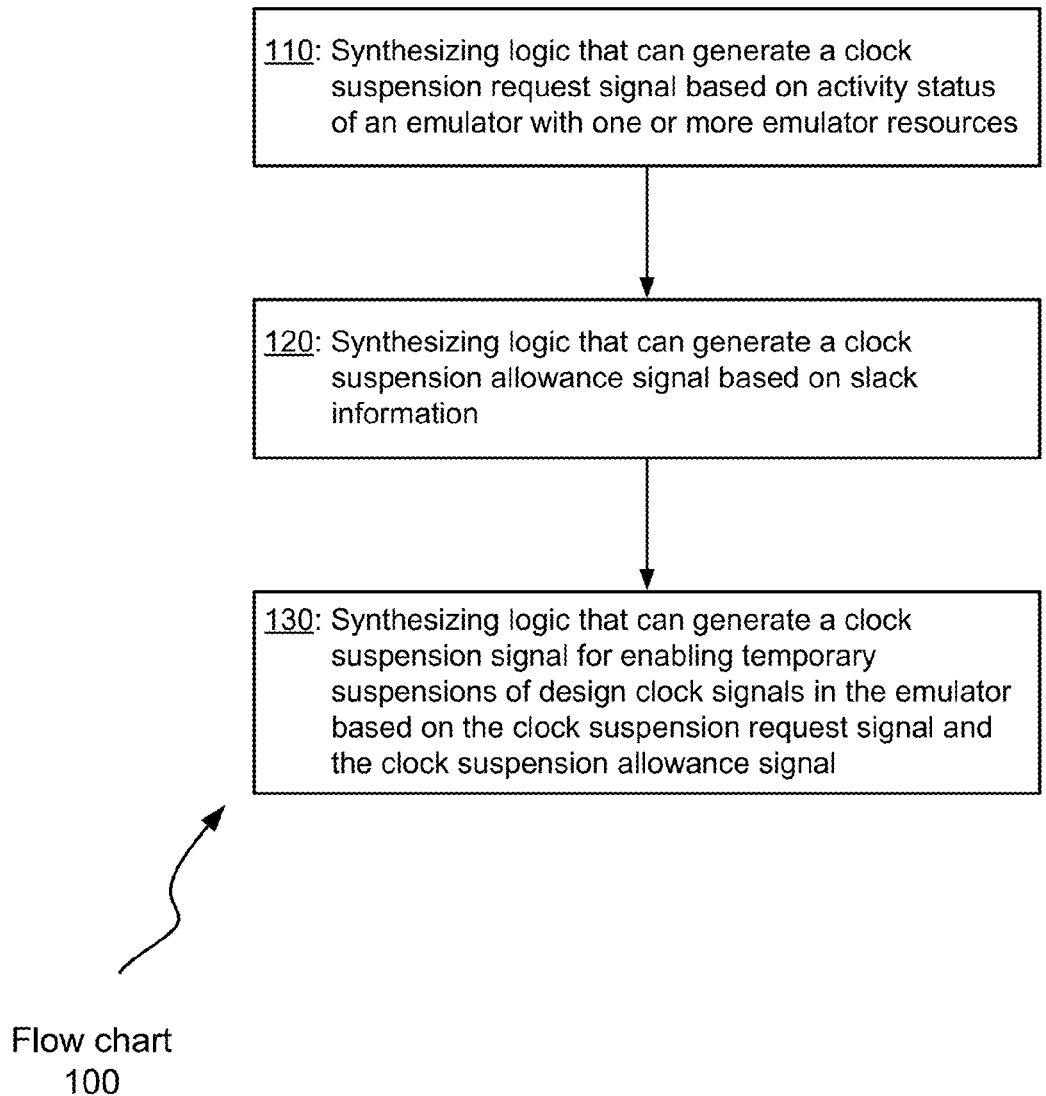
FIG. 1 illustrates a flow chart describing methods for adaptive clock management in emulation that may be employed by various embodiments of the invention.

FIG. 1 illustrates a flow chart 100 describing methods for adaptive clock management in emulation that may be employed by various embodiments of the invention. For ease of understanding, the flow chart 100 will be described with reference to a block diagram of adaptive clock management logic 200 illustrated in FIG. 2 and clock signal waveforms illustrated in FIG. 3. It should be appreciated, however, that alternate implementations of logic for adaptive clock management may be used to perform the method of adaptive clock management shown in the flow chart 100 according to various embodiments of the invention. In addition, it should be appreciated that implementations of the adaptive clock management logic 200 may be employed with other methods of adaptive clock management according to different embodiments of the invention.

Figure 2:
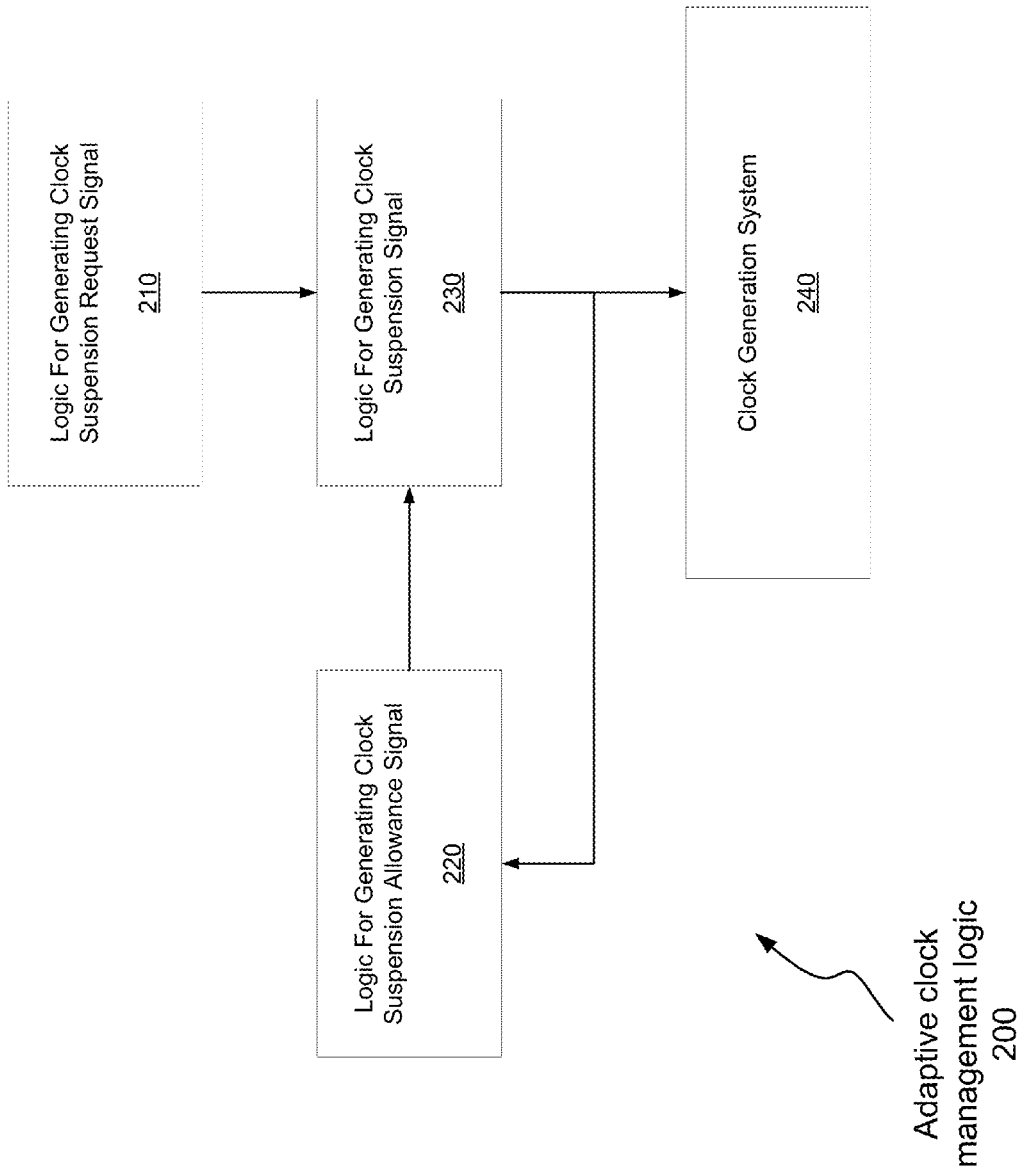
FIG. 2 illustrates a block diagram of adaptive clock management logic that may be employed by various embodiments of the invention.

In operation 110 of the flowchart 100, logic that can generate a clock suspension request signal based on activity status information of an emulator with one or more emulator resources is synthesized. In FIG. 2, this logic is illustrated with a logic block 210. The one or more emulator resources may comprise software environment such as the workstation for the emulator. Additionally or alternatively, the one or more emulator resources may comprise hardware resources such as a design memory.

As noted previously, for example, communications between the emulator and its software environment such as a workstation often cannot keep up with the speed of the emulation process. To reduce or eliminate the lag, temporary suspensions of design clock signals in the emulator may be performed during emulation. The clock suspension request signal is used to indicate when a suspension of design clock signals is needed.

The logic block 210 generates the clock suspension request signal based on the activity status information. The activity status information may be determined based on data generation speed information, data transfer speed information, data buffer status information, or any combination thereof. For example, a data buffer is often employed to facilitate data transfer from the emulator to its software environment. By monitoring status of the data buffer, the logic block 210 detects when data transfer starts to lag behind data generation. The detection may trigger a change of the clock suspension request signal, signaling a clock suspension request.

In operation 120 of the flowchart 100, logic that can generate a clock suspension allowance signal based on slack information related to speed constraints of one or more clock signals associated with one or more dynamic targets of the emulator is synthesized. The slack information may be determined based on speed constraints of one or more clock signals associated with one or more dynamic targets of the emulator. In FIG. 2, this logic is illustrated with a logic block 220.

Figure 5:
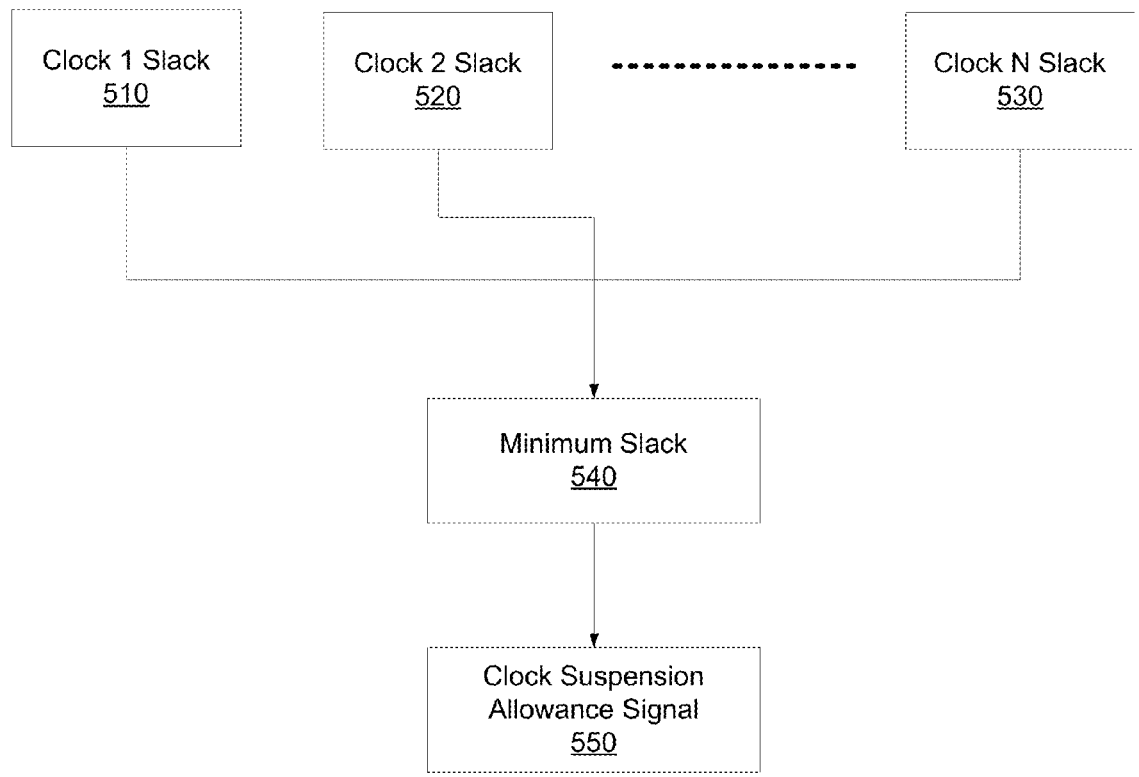
FIG. 5 illustrates a block diagram of logic for generating clock suspension allowance signal (Logic 220 in FIG. 2) that may be employed by various embodiments of the invention.

Also as noted previously, a clock signal for a dynamic target cannot operate below a certain limit. To avoid problems related to a specific dynamic target, a suspension of design clock signals should be executed only when there is a slack between the current clock signal speed for the specific dynamic target and the minimal allowed speed. The logic block 220 generates the clock suspension allowance signal to indicate whether a suspension of design clock signals is permitted considering all dynamic targets. An example of a block diagram for the logic block 220 is illustrated in FIG. 5. In the figure, each of Clock 1 Slack 510, Clock 2 Slack 520 . . . Clock N Slack 530 represents a logic block for monitoring slack status for a specific clock signal associated with a specific dynamic target. The slack information for individual clock signals is analyzed by a logic block 540, Minimum Slack, to determine minimum slack information. The minimum slack information is provided to a logic block 550, Clock Suspension Allowance Signal, for activating/inactivating the clock suspension allowance signal.

Figure 3:
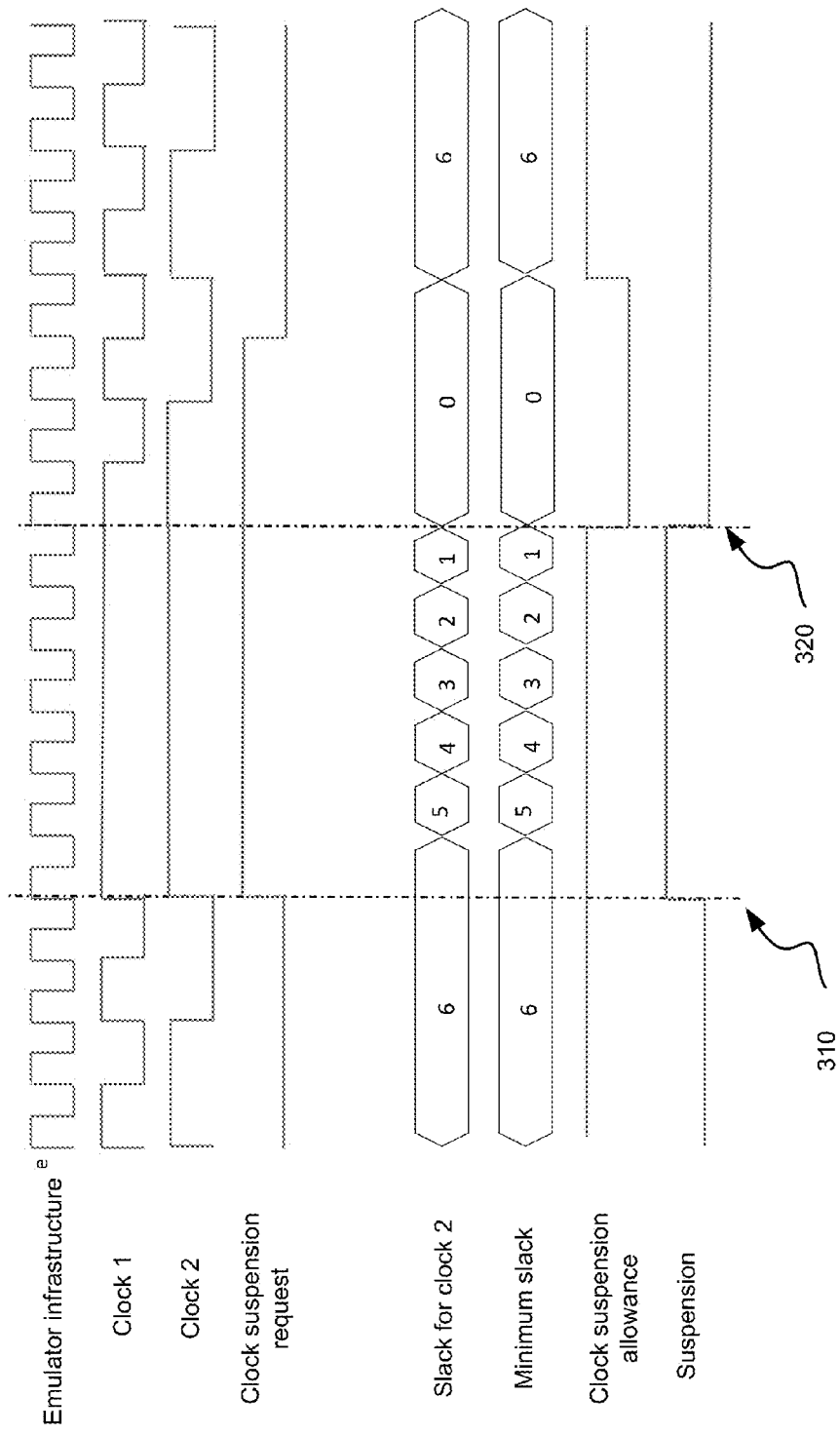
FIG. 3 illustrates an example of clock signal waveforms for adaptive clock management.

The clock suspension allowance signal generation is illustrated by a simple example shown in FIG. 3. In FIG. 3, clock 1 and clock 2 are specified by design to operate at 100 MHz and 50 MHz, respectively. Both of the clock signals, however, run at slower speeds in emulation as the emulator infrastructure clock signal operates at only 1 MHz. While there is no constraint as to how slow the clock 1 runs, the clock 2 cannot be operated at a speed slower than 100 KHz as it is associated with a dynamic target. This translates to a maximum time period of ten emulator infrastructure clock cycles for which the clock 2 may be suspended. Because only clock 2 has a constraint, the slack for clock 2 is the minimum slack for the whole system. To be safe, six instead of ten emulator infrastructure clock cycles are set as a maximum slack for design clock suspension. In this example, the clock suspension request signal is activated at the first dotted line 310, immediately triggering a clock suspension illustrated by a signal labeled "suspension". The clock suspension lasts until all of the six emulator infrastructure clock cycles are used. At the second dotted line 320, the clock suspension allowance signal switches to low, terminating the clock suspension despite the fact that the clock suspension request signal is still activated.

In operation 130 of the flowchart 100, logic that can generate a clock suspension signal for enabling temporary suspensions of design clock signals in the emulator based on the clock suspension request signal and the clock suspension allowance signal is synthesized. In FIG. 2, this logic is illustrated with a logic block 230. The logic block 230 receives the clock suspension request signal and the clock suspension allowance signal from the logic block 210 and the logic block 220, respectively, and supplies the clock suspension signal to a clock generation system 240 for executing design clock suspensions. The logic block 220 may also use the clock suspension signal for determining the slack information.

Figure 6:
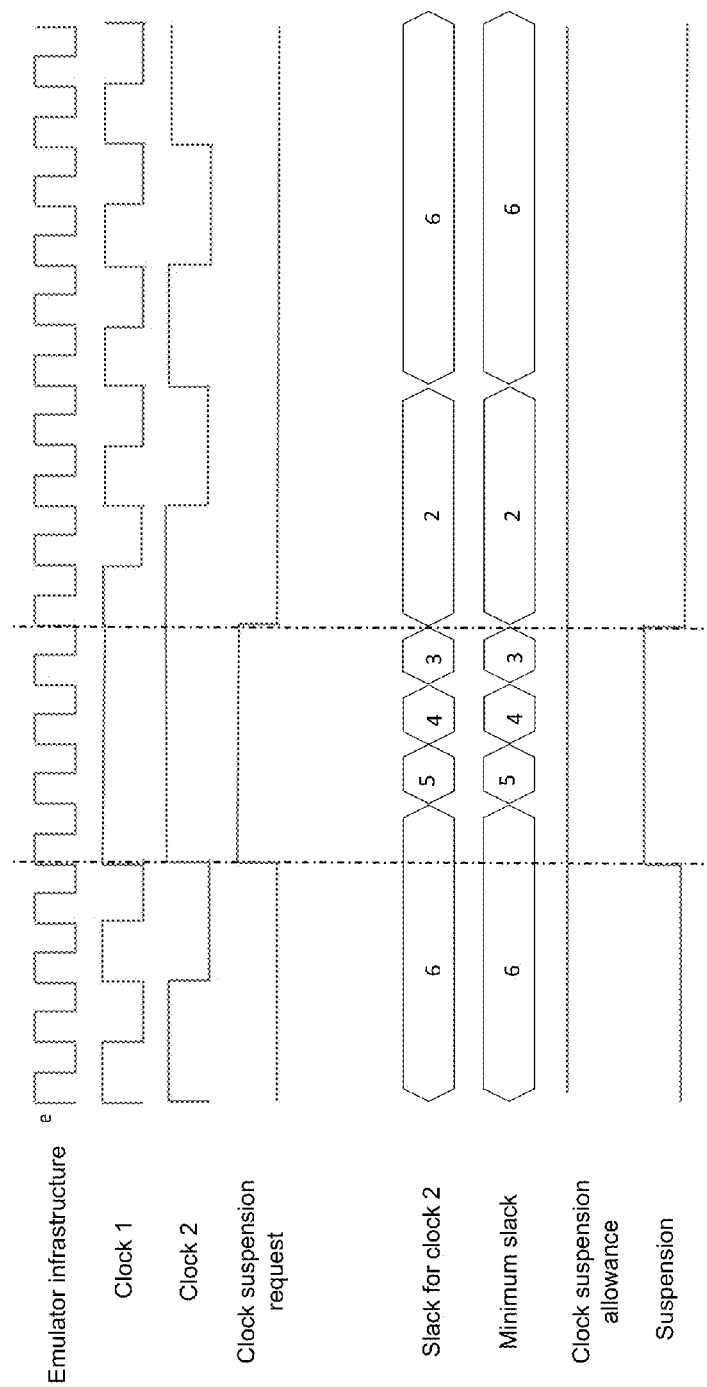
FIG. 6 illustrates an example of clock signal waveforms for a method of clock suspension signal activation that attempts to minimize communication data loss.
Figure 7:
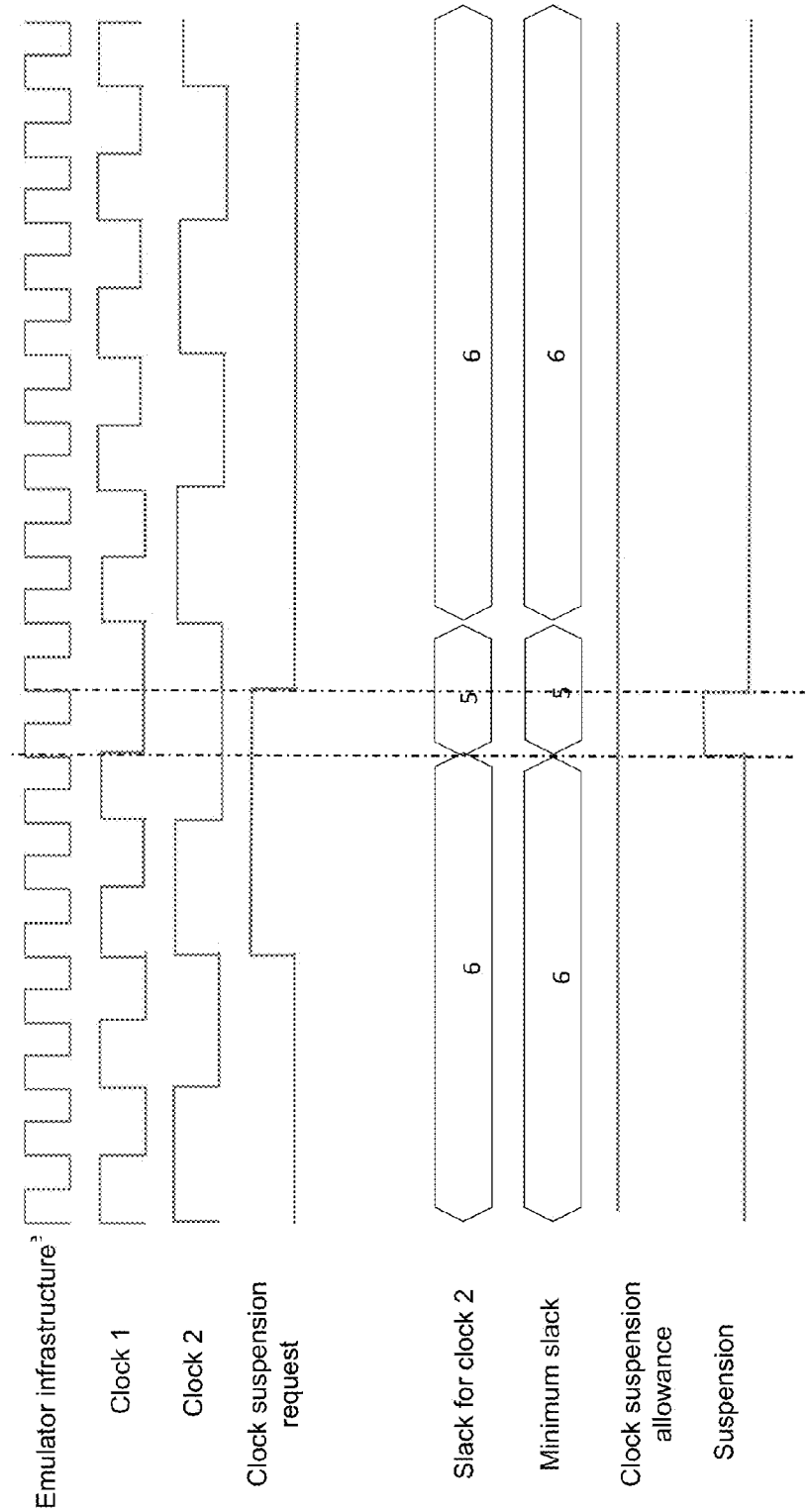
FIG. 7 illustrates an example of clock signal waveforms for a method of clock suspension signal activation that attempts to minimize emulation speed loss.
Figure 8:
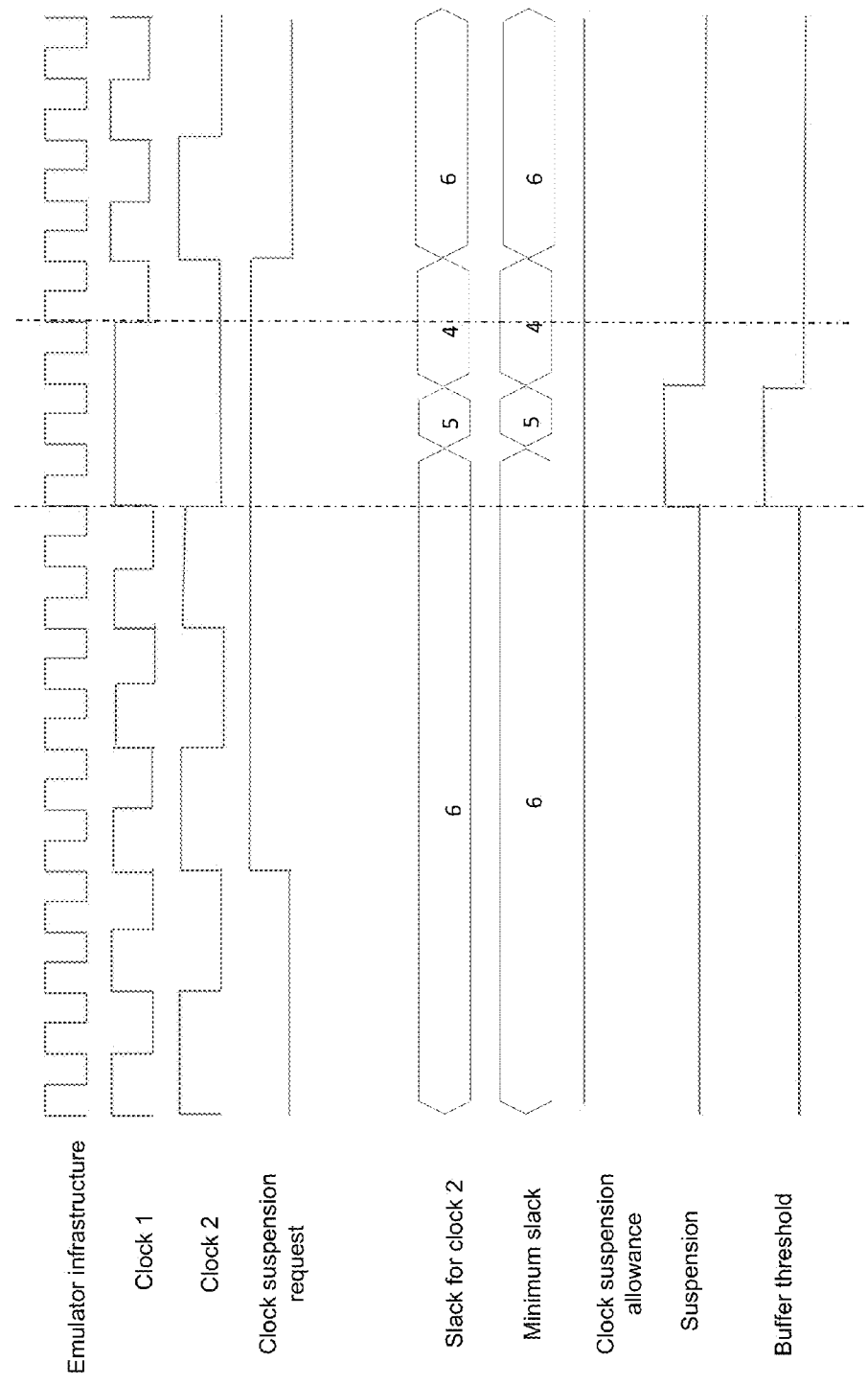
FIG. 8 an example of clock signal waveforms for a method of clock suspension signal activation that attempts to balance communication data loss and emulation speed loss.

The clock suspension signal may be activated only when both of the clock suspension request signal and the clock suspension allowance signal are activated. Exactly when to activate the clock suspension signal depends upon the method employed by the logic block 230. FIGS. 6-8 employ the same example as the one in FIG. 3 to illustrate three different methods for activating the clock suspension signal. For simplicity, the clock suspension allowance signal remains activated in all of the three figures.

In FIG. 6, the logic block 230 activates the clock suspension signal immediately after the clock suspension request signal is activated. After four emulator infrastructure clock cycles, the clock suspension request signal switches to low, indicating no more slowdown is needed. Accordingly, the clock suspension signal becomes inactivated while there is still a slack of two emulator infrastructure clock cycles left. This approach may minimize communication data loss, but the overall emulation speed can be sacrificed significantly.

In FIG. 7, the logic block 230 activates the clock suspension signal only when a next design clock edge is for a clock signal associated with a dynamic target. In the figure, the clock suspension signal is not activated immediately after the clock suspension request signal is activated, but switches after additional three emulator infrastructure clock cycles. This is because the next design clock edge is for clock 2 (also for clock 1 in this example). The clock suspension signal remains activated for only one emulator infrastructure clock cycle until the request signal switches to low. This tends to favor emulation speed over communication data loss reduction.

In FIG. 8, the logic block 230 activates the clock suspension signal only when the data buffer is filled up to a predefined threshold. In the illustrated example, this happens in six emulator infrastructure clock cycles since the clock suspension request signal is activated. A buffer threshold signal is used to trigger the clock suspension signal. The predefined threshold may be set based on a desired trade-off between the communication data loss and the emulation speed loss. For example, a threshold of 90% of the data buffer would be better for maintaining the emulation speed than for reducing communication data loss. Similarly, a low threshold might minimize the risk of data loss with an increased cost of emulation speed.

The two heuristic techniques in FIGS. 7 and 8 may be combined as well. A safe buffer threshold may be predetermined and used as an additional check for the technique in FIG. 7. As such, maintaining the emulator speed is favored unless the risk of data loss becomes significant.

Although four specific techniques have been discussed here, a person of ordinary skill in the art would appreciate that there are many other specific techniques that may vary in degrees of trade-off and/or may use other kind of parameters for adaptive managing design clocks.

Figure 4:
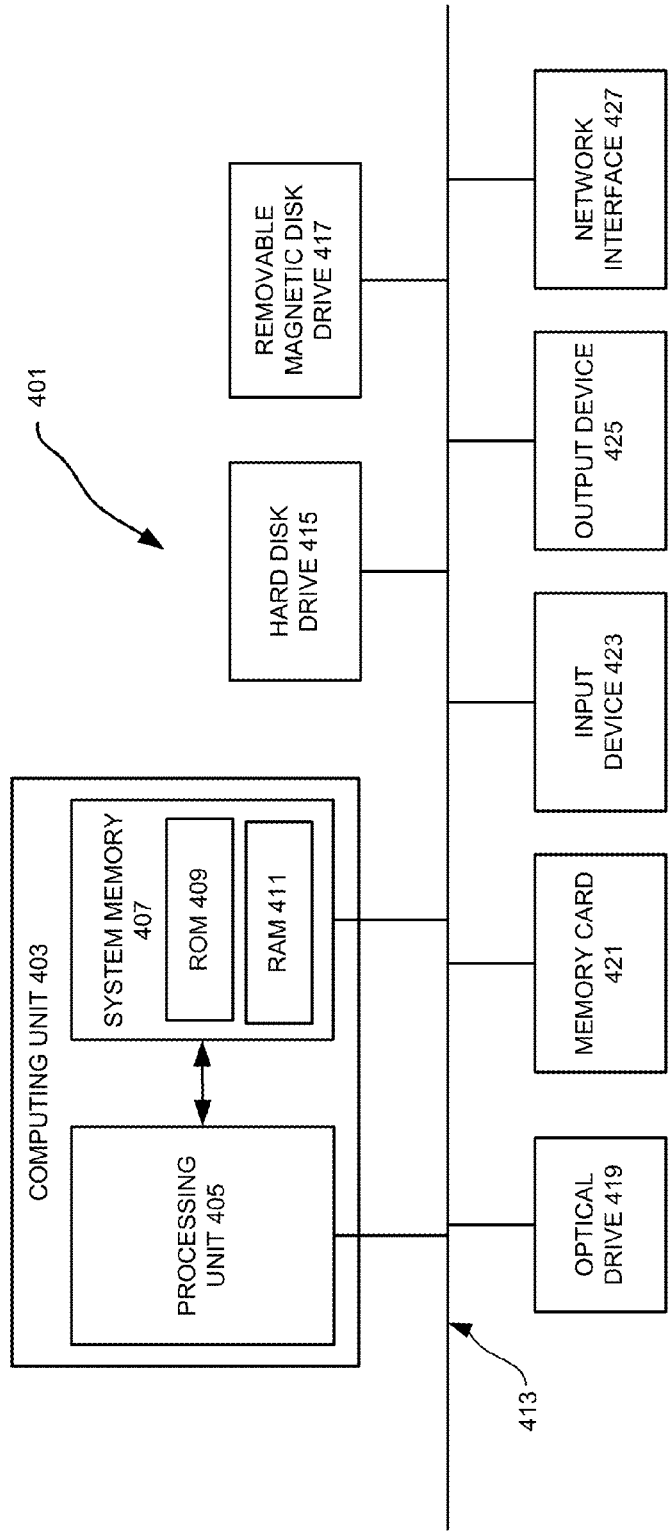
FIG. 4 illustrates a programmable computer system with which various embodiments of the invention may be employed.

Various embodiments of the invention may be implemented through the execution of software instructions by a computing device, such as a programmable computer. FIG. 4 shows an illustrative example of such a programmable computer (a computing device 401). As seen in this figure, the computing device 401 includes a computing unit 403 with a processing unit 405 and a system memory 407. The processing unit 405 may be any type of programmable electronic device for executing software instructions, but will conventionally be a microprocessor. The system memory 407 may include both a read-only memory (ROM) 409 and a random access memory (RAM) 411. As will be appreciated by those of ordinary skill in the art, both the read-only memory (ROM) 409 and the random access memory (RAM) 411 may store software instructions for execution by the processing unit 405.

The processing unit 405 and the system memory 407 are connected, either directly or indirectly, through a bus 413 or alternate communication structure, to one or more peripheral devices. For example, the processing unit 405 or the system memory 407 may be directly or indirectly connected to one or more additional memory storage devices, such as a "hard" magnetic disk drive 415, a removable magnetic disk drive 417, an optical disk drive 419, or a flash memory card 421. The processing unit 405 and the system memory 407 also may be directly or indirectly connected to one or more input devices 423 and one or more output devices 425. The input devices 423 may include, for example, a keyboard, a pointing device (such as a mouse, touchpad, stylus, trackball, or joystick), a scanner, a camera, and a microphone. The output devices 425 may include, for example, a monitor display, a printer and speakers. With various examples of the computer 401, one or more of the peripheral devices 415-425 may be internally housed with the computing unit 403. Alternately, one or more of the peripheral devices 415-425 may be external to the housing for the computing unit 403 and connected to the bus 413 through, for example, a Universal Serial Bus (USB) connection.

With some implementations, the computing unit 403 may be directly or indirectly connected to one or more network interfaces 427 for communicating with other devices making up a network. The network interface 427 translates data and control signals from the computing unit 403 into network messages according to one or more communication protocols, such as the transmission control protocol (TCP) and the Internet protocol (IP). Also, the interface 427 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 401 is illustrated as an example only, and it is not intended to be limiting. Various embodiments of the invention may be implemented using one or more computing devices that include the components of the computer 401 illustrated in FIG. 4, which include only a subset of the components illustrated in FIG. 4, or which include an alternate combination of components, including components that are not shown in FIG. 4. For example, various embodiments of the invention may be implemented using a multi-processor computer, a plurality of single and/or multiprocessor computers arranged into a network, or some combination of both.

Some other embodiments of the invention may be implemented by software instructions, stored on a non-transitory computer-readable medium, for instructing one or more programmable computers/computer systems to perform operations such as those shown in the flow chart 400 in FIG. 4. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:
1. A method, comprising:
 synthesizing, using a programmable computer, logic that can generate a clock suspension request signal based on activity status information of an emulator with one or more emulator resources;
 synthesizing, using a programmable computer, logic that can generate a clock suspension allowance signal based on slack information related to speed constraints of one or more clock signals associated with one or more dynamic targets of the emulator; and
 synthesizing, using a programmable computer, logic that can generate a clock suspension signal for enabling temporary suspensions of design clock signals in the emulator based on the clock suspension request signal and the clock suspension allowance signal.

2. The method recited in claim 1, wherein the one or more emulator resources comprise software environment.

3. The method recited in claim 1, wherein the one or more emulator resources comprise a design memory.

4. The method recited in claim 1, wherein the activity status information is determined based on data generation speed information, data transfer speed information, data buffer status information, or any combination thereof.

5. The method recited in claim 1, wherein the speed constraints of the one or more clock signals comprise information of a maximum number of emulator infrastructure clock periods allowed for suspending each of the one or more clock signals.

6. The method recited in claim 1, wherein the clock suspension signal is activated only when both of the clock suspension request signal and the clock suspension allowance signal are activated.

7. The method recited in claim 6, wherein the clock suspension signal is activated immediately after the clock suspension request signal is activated.

8. The method recited in claim 6, wherein the clock suspension signal is activated if a next design clock edge is for a clock signal associated with a dynamic target.

9. The method recited in claim 6, wherein the clock suspension signal is activated when a data buffer for communication with the software environment is filled to a threshold level.

10. One or more non-transitory computer-readable media storing computer-executable instructions for causing one or more processors to perform a method, the method comprising:

synthesizing using a programmable computer, logic that can generate a clock suspension request signal based on activity status information of an emulator with one or more emulator resources;

synthesizing, using a programmable computer, logic that can generate a clock suspension allowance signal based on slack information related to speed constraints of one or more clock signals associated with one or more dynamic targets of the emulator; and synthesizing, using a programmable computer, logic that can generate a clock suspension signal for enabling temporary suspensions of design clock signals in the emulator based on the clock suspension request signal and the clock suspension allowance signal.

11. The one or more non-transitory computer-readable media recited in claim 10, wherein the one or more emulator resources comprise software environment.

12. The one or more non-transitory computer-readable media recited in claim 10, wherein the one or more emulator resources comprise a design memory.

13. The one or more non-transitory computer-readable media recited in claim 10, wherein the activity status information is determined based on data generation speed information, data transfer speed information, data buffer status information, or any combination thereof.

14. The one or more non-transitory computer-readable media recited in claim 10, wherein the speed constraints of the one or more clock signals comprise information of a maximum number of emulator infrastructure clock periods allowed for suspending each of the one or more clock signals.

15. The one or more non-transitory computer-readable media recited in claim 10, wherein the clock suspension signal is activated only when both of the clock suspension request signal and the clock suspension allowance signal are activated.

16. The one or more non-transitory computer-readable media recited in claim 15, wherein the clock suspension signal is activated immediately after the clock suspension request signal is activated.

17. The one or more non-transitory computer-readable media recited in claim 15, wherein the clock suspension signal is activated if a next design clock edge is for a clock signal associated with a dynamic target.

18. The one or more non-transitory computer-readable media recited in claim 15, wherein the clock suspension signal is activated when a data buffer for communication with the software environment is filled to a threshold level.

19. A method, comprising:

generating, by logic for generating clock suspension request signal, a clock suspension request signal based on activity status information of an emulator with one or more emulator resources;

generating, by logic for generating clock suspension allowance signal, a clock suspension allowance signal based on slack information related to speed constraints of one or more clock signals associated with one or more dynamic targets of the emulator; and generating, by logic for generating clock suspension signal, a clock suspension signal for enabling temporary suspensions of design clock signals in the emulator based on the clock suspension request signal and the clock suspension allowance signal.

20. The method recited in claim 19, wherein the one or more emulator resources comprise software environment.

21. The method recited in claim 19, wherein the one or more emulator resources comprise a design memory.

22. The method recited in claim 19, wherein the activity status information is determined based on data generation speed information, data transfer speed information, data buffer status information, or any combination thereof.

23. The method recited in claim 19, wherein the speed constraints of the one or more clock signals comprise information of a maximum number of emulator infrastructure clock periods allowed for suspending each of the one or more clock signals.

24. The method recited in claim 19, wherein the clock suspension signal is activated only when both of the clock suspension request signal and the clock suspension allowance signal are activated.

25. The method recited in claim 24, wherein the clock suspension signal is activated immediately after the clock suspension request signal is activated.

26. The method recited in claim 24, wherein the clock suspension signal is activated if a next design clock edge is for a clock signal associated with a dynamic target.

27. The method recited in claim 24, wherein the clock suspension signal is activated when a data buffer for communication with the software environment is filled to a threshold level.

* * * * *